United States Patent
Hunt

(10) Patent No.: US 8,385,144 B2
(45) Date of Patent: Feb. 26, 2013

(54) UTILIZING TWO ALGORITHMS TO DETERMINE A DELAY VALUE FOR TRAINING DDR3 MEMORY

(75) Inventor: Brandon L. Hunt, Colorado Springs, CO (US)

(73) Assignee: LSI Corporation, Milpitas, CA (US)

( * ) Notice: Subject to any disclaimer, the term of this patent is extended or adjusted under 35 U.S.C. 154(b) by 245 days.

(21) Appl. No.: 13/034,917

(22) Filed: Feb. 25, 2011

(65) Prior Publication Data

US 2012/0218841 A1 Aug. 30, 2012

(51) Int. Cl.
*G11C 7/00* (2006.01)

(52) U.S. Cl. ..... 365/193; 365/191; 365/194; 365/233.1; 365/233.13

(58) Field of Classification Search .......... 365/193, 365/191, 194, 233.1, 233.13
See application file for complete search history.

(56) References Cited

U.S. PATENT DOCUMENTS

| 6,493,285 | B1 * | 12/2002 | Wolford | 365/185.17 |
| 7,791,964 | B2 * | 9/2010 | Lee et al. | 365/193 |
| 7,898,878 | B2 * | 3/2011 | Nguyen et al. | 365/189.07 |
| 7,928,790 | B2 * | 4/2011 | Szczypinski | 327/261 |
| 2009/0244997 | A1 | 10/2009 | Searles et al. | |
| 2010/0118627 | A1 * | 5/2010 | Best | 365/193 |
| 2010/0246291 | A1 | 9/2010 | Espinoza et al. | |
| 2012/0033514 | A1 * | 2/2012 | Best | 365/193 |

\* cited by examiner

*Primary Examiner* — Pho M Luu
(74) *Attorney, Agent, or Firm* — Suiter Swantz pc llo

(57) ABSTRACT

A method for training an electronic memory may include receiving a first delay value and a second delay value. The first delay value and the second delay value may be associated with a first data strobe indicating when to sample data on a first memory lane of the electronic memory. The method may also include determining a difference between the first delay value and the second delay value. The method may further include receiving a third delay value associated with a second data strobe indicating when to sample data on a second memory lane of the electronic memory. The method may also include determining a fourth delay value for the second memory lane of the electronic memory utilizing the third delay value and the determined difference between the first delay value and the second delay value.

20 Claims, 1 Drawing Sheet

UTILIZING TWO ALGORITHMS TO DETERMINE A DELAY VALUE FOR TRAINING DDR3 MEMORY

TECHNICAL FIELD

The present disclosure generally relates to the field of electronic data storage, and more particularly to a method for training an electronic memory, such as DDR3 memory, or the like.

BACKGROUND

Double Data Rate (DDR) Dynamic Random Access Memory (DRAM) generally needs to be trained before it may be utilized. For example, hardware registers are typically programmed with values to cause delays so that commands and data may be sent and received when expected. In DDR3 memory, this calibration may be performed on a per lane basis, because the commands and data may propagate to each DRAM component in a memory module at a different time. For instance, a DDR DRAM interface may include two signal classes, DQ for data and a DQS data strobe. During a read operation, the DDR DRAM may issue these two signal classes at the same time, e.g., as edge aligned signals. Then, to correctly acquire data sent from the DDR DRAM, a DRAM controller may utilize a Delay-Locked Loop (DLL) circuit to delay the DQS signal so that it may correctly latch the DQ signals. Similarly, the DRAM controller may also utilize DLL circuits to support writing data to the DDR DRAM. However, topological and electrical differences between DQ and DQS interconnections can make it difficult to determine appropriate delays for the DLL.

Timing delays provided by DLL circuits may often be customized for a particular design configuration, such as by utilizing a training program stored in a Basic Input/Output System (BIOS) memory device and/or implemented within device hardware/firmware. The training program may execute an algorithm to determine appropriate timing delays associated with various memory interface signals. An algorithm for training a DDR3 memory may often be required to execute on a variety of circuit boards and memory combinations. Variances may be present in these different configurations that are difficult for a single set of algorithms to account for. For example, an algorithm may be required to find a certain point of a DQS strobe signal and indicate a hardware delay to inform a training entity (e.g., firmware) of a characteristic of the DQS signal at that point. If the algorithm fails to find the necessary delay, the DDR training may not be able to continue, and the DDR memory may be unusable. Complications in finding the desired point of the DQS signal may include jitter, the signal being tri-stated at times, and other factors that may cause the strobe signal to look different than expected.

SUMMARY

A method for training an electronic memory may include receiving a first delay value and a second delay value. The first delay value and the second delay value may be associated with a first data strobe indicating when to sample data on a first memory lane of the electronic memory. The method may also include determining a difference between the first delay value and the second delay value. The method may further include receiving a third delay value associated with a second data strobe indicating when to sample data on a second memory lane of the electronic memory. The method may also include determining a fourth delay value for the second memory lane of the electronic memory utilizing the third delay value and the determined difference between the first delay value and the second delay value. The method may further include training the electronic memory by associating the fourth delay value with the second memory lane.

The method may further include receiving a fifth delay value and a sixth delay value. The fifth delay value and the sixth delay value may be associated with a third data strobe indicating when to sample data on a third memory lane of the electronic memory. The method may also include determining a difference between the fifth delay value and the sixth delay value. The method may further include combining (A) the determined difference between the first delay value and the second delay value, and (B) the determined difference between the fifth delay value and the sixth delay value. The method may also include determining a fourth delay value for the second memory lane of the electronic memory utilizing combined difference for (A) the first delay value and the second delay value, and (B) the fifth delay value and the sixth delay value.

The method may further include receiving a seventh delay value and an eighth delay value. The seventh delay value and the eighth delay value may be associated with a fourth data strobe indicating when to sample data on a fourth memory lane of the electronic memory. The method may also include determining a difference between the seventh delay value and the eighth delay value. The method may further include combining at least two of (A) the determined difference between the first delay value and the second delay value, (B) the determined difference between the fifth delay value and the sixth delay value, and (C) the determined difference between the seventh delay value and the eighth delay value. The method may further include determining a fourth delay value for the second memory lane of the electronic memory utilizing the combined difference for at least two of (A) the first delay value and the second delay value, (B) the fifth delay value and the sixth delay value, and (C) the seventh delay value and the eighth delay value.

It is to be understood that both the foregoing general description and the following detailed description are exemplary and explanatory only and are not necessarily restrictive of the present disclosure. The accompanying drawings, which are incorporated in and constitute a part of the specification, illustrate subject matter of the disclosure. Together, the descriptions and the drawings serve to explain the principles of the disclosure.

BRIEF DESCRIPTION OF THE DRAWINGS

The numerous advantages of the disclosure may be better understood by those skilled in the art by reference to the accompanying figures in which.

DETAILED DESCRIPTION

Reference will now be made in detail to the subject matter disclosed, which is illustrated in the accompanying drawings.

Figure 1:
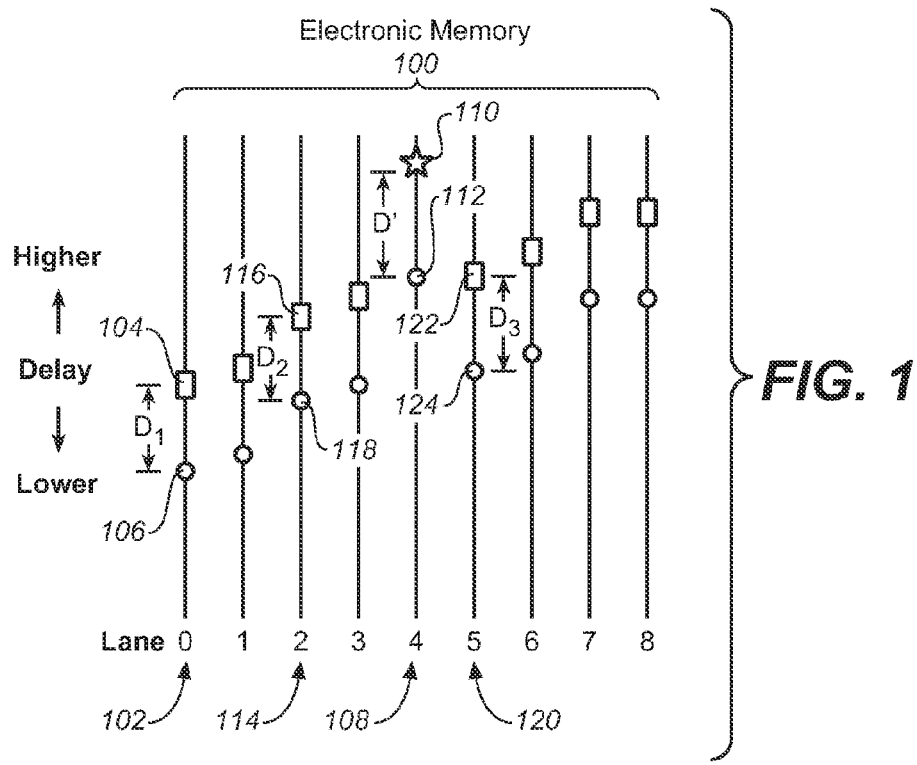
FIG. 1 is a schematic illustrating an electronic memory including a number of memory lanes.
Figure 2:
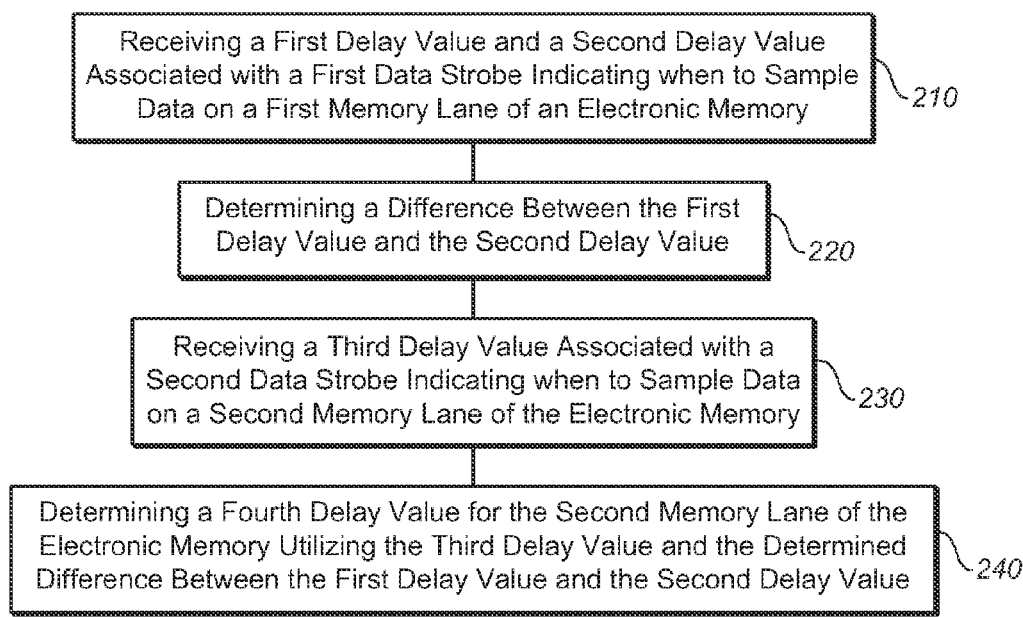
FIG. 2 is a flow diagram illustrating a method for training an electronic memory.

Referring generally to FIGS. 1 and 2, a delay value for an electronic memory lane may be determined utilizing the results of a first algorithm and a second algorithm for determining a delay value for another memory lane. The resulting value may be utilized to train the electronic memory. For example, a primary algorithm may utilize one technique to find a delay value for a memory lane, while a secondary algorithm may utilize another technique to find a delay value for the same memory lane. In some implementations, the likelihood of the secondary algorithm failing to find the delay value needed for a memory lane may be less than the likelihood of the primary algorithm failing to find a delay value for the memory lane. However, values found by the secondary algorithm may be different than values found by the first algorithm; thus, the rest of the existing training procedures may not be able to utilize values found with the secondary algorithm (e.g., when values found with the primary algorithm are required for training the electronic memory).

A relationship may be determined between the values found with the primary algorithm and the secondary algorithm. This relationship may be utilized to determine a value needed for a lane on which the primary algorithm fails to find a delay value. For example, on each lane for which the primary and secondary algorithms find a value, the difference between the two values may be calculated, and then combined/averaged. The combined difference may then be added or subtracted from one or more values found by a secondary algorithm when a value is not found by a primary algorithm. The resulting value may then be utilized by the remainder of a training procedure. Alternatively, a difference between values found for a single memory lane may be applied to a value found by a secondary algorithm on another memory lane. In still further implementations, values found by more two algorithms may be averaged together. For instance, values found by three algorithms may be averaged together.

Referring to FIGS. 1 and 2, a method 200 for training an electronic memory 100 is described. The method 200 may include receiving a delay value 104 and a delay value 106 associated with a data strobe indicating when to sample data on a memory lane 102 of the electronic memory 100 (e.g., as described in FIG. 2, step 210). In embodiments, a hardware register associated with the memory lane 102 may be programmed with a delay value for data strobes on the memory lane 102, so that commands and data may be sent and received when expected. For example, during a read cycle, the electronic memory 100 may transmit a memory data strobe signal DQS that is nominally aligned with transitions of a data signal DQ. During a write cycle, a memory controller coupled with the electronic memory 100 may transmit a memory data strobe signal DQS that is nominally centered on transitions of the data signal DQ. However, because of physical distances involved in the signal transmissions and/or relatively high speeds of operation, the data strobe signal DQS signal may arrive out of phase with respect to the data signal DQ. Thus, it may be necessary to delay outgoing DQ and DQS signals during a write operation, and to delay incoming DQS signals during a read operation.

In embodiments, the electronic memory 100 may be implemented as a DDR3 memory, an implementation that divides output data words into 8-bit lanes, providing a separate data strobe signal DQS for each lane. Alternatively, the electronic memory 100 may be implemented as another type of electronic memory utilizing a strobe signal to indicate when data should be sampled on an electronic lane. Because a single algorithm may fail to find the necessary delay for each memory lane of the electronic memory 100, the delay value 104 for the memory lane 102 may be determined utilizing one algorithm, and the delay value 106 for the memory lane 102 may be determined utilizing a different algorithm. The results of the two algorithms may then be examined across the different lanes, and missing data values may be determined based upon data values which were found for the various lanes.

Thus, two (or more) algorithms may be utilized to find a point on a DQS signal for each lane of the DDR3 memory. In embodiments, the DQS signal is implemented as a data strobe for indicating when to sample data on a particular lane. The algorithms may be utilized to find the "preamble" on each lane, or the point at which the DQS signal is driven low for an entire clock cycle, after being asserted. One algorithm may be utilized to find a first rising edge of the signal on each lane. For example, in a specific implementation, the first algorithm may be utilized to determine when to open an AND gate. A second algorithm may be utilized to find a point somewhere in the preamble of the signal. However, a value found by the second algorithm may not necessarily correspond to a value the first algorithm would have found, which may prevent a training algorithm from effectively utilizing the value from the second algorithm. Thus, the value found by the second algorithm may be adjusted to a value closer to what the first algorithm would have found. This value may then be provided to a training algorithm, which may then utilize the information provided by the first algorithm, the second algorithm, or both algorithms to find the rising edge of the DQS signal.

The method 200 may also include determining a difference $D_1$ between the delay value 104 and the delay value 106 (e.g., as described in FIG. 2, step 220). For example, the delay value 106 may be subtracted from the delay value 104. The method 200 may further include receiving a delay value 112 associated with a data strobe indicating when to sample data on a memory lane 108 of the electronic memory 100 (e.g., as described in FIG. 2, step 230). The method 200 may also include determining a delay value 110 for the memory lane 108 of the electronic memory 100 utilizing the delay value 112 and the difference between the delay value 104 and the delay value 106 (e.g., as described in FIG. 2, step 240). For example, a difference D' may be determined based upon the difference $D_1$ between the delay value 104 and the delay value 106. In a specific instance, the difference D' may be equal to the difference $D_1$. This difference may then be added to the delay value 112. Alternatively, the delay value 104 may be subtracted from the delay value 106, and the difference may be subtracted from the delay value 112.

The method 200 may further include receiving a delay value 116 and a delay value 118 associated with a data strobe indicating when to sample data on a memory lane 114 of the electronic memory 100. The method 200 may also include determining a difference $D_2$ between the delay value 116 and the delay value 118. The method 200 may further include combining (A) the difference $D_1$ between the delay value 104 and the delay value 106, and (B) the difference $D_2$ between the delay value 116 and the delay value 118. For example, in one instance, the difference $D_1$ may be averaged with the difference $D_2$ to determine the difference D'. In another instance, a weighted average may be applied to the difference $D_1$ and the difference $D_2$ to determine the difference D'. The method 200 may also include determining the delay value 110 for the memory lane 108 of the electronic memory 100 utilizing the delay value 112 and the combined difference D' for (A) the delay value 104 and the delay value 106, and (B) the delay value 116 and the delay value 118.

The method 200 may further include receiving a delay value 122 and a delay value 124 associated with a data strobe indicating when to sample data on a memory lane 120 of the electronic memory 100. The method 200 may also include determining a difference $D_3$ between the delay value 122 and the delay value 124. The method 200 may further include combining at least two of (A) the difference $D_1$ between the delay value 104 and the delay value 106, (B) the difference $D_2$ between the delay value 116 and the delay value 118, and (C) the difference $D_3$ between the delay value 122 and the delay value 124. The method 200 may also include determining the delay value 110 for the memory lane 108 of the electronic memory 100 utilizing the delay value 112 and the combined difference D' for at least two of (A) the delay value 104 and the delay value 106, (B) the delay value 116 and the delay value 118, and (C) the delay value 122 and the delay value 124.

For example, in some embodiments, the difference $D_1$, the difference $D_2$, and the difference $D_3$ may be averaged together to determine the combined difference D'. In other embodiments, a weighted average may be applied to the difference $D_1$, the difference $D_2$, and the difference $D_3$ to determine the difference D'. Alternatively, the difference $D_3$ may be discarded (i.e., excluded from the combined difference D'), such as when a statistical analysis determines that the difference $D_3$ is an outlying value (e.g., when the difference $D_3$ is greater than/less than a threshold determined utilizing a statistical analysis, or the like). After the delay value 110 has been determined for the memory lane 108, this value may be utilized to train the electronic memory 100. For example, a hardware register associated with the memory lane 108 may be programmed with the delay value 110. It should be noted that this example is provided by way of illustration only, and is not meant to be restrictive of the present disclosure. Thus, in other implementations, the delay value 110 may be utilized by subsequent training algorithms. Further, additional calibration may be performed internally in the hardware to fine tune the delay value 110, in order to determine a final value.

In the present disclosure, the methods disclosed may be implemented as sets of instructions or software readable by a device. Further, it is understood that the specific order or hierarchy of steps in the methods disclosed are examples of exemplary approaches. Based upon design preferences, it is understood that the specific order or hierarchy of steps in the method can be rearranged while remaining within the disclosed subject matter. The accompanying method claims present elements of the various steps in a sample order, and are not necessarily meant to be limited to the specific order or hierarchy presented.

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes.

What is claimed is:

1. A method for training an electronic memory, comprising:
    using a computer or processor to perform the steps of:
    receiving a first delay value and a second delay value, where the first delay value and the second delay value are associated with a first data strobe indicating when to sample data on a first memory lane of the electronic memory;
    determining a difference between the first delay value and the second delay value;
    receiving a third delay value associated with a second data strobe indicating when to sample data on a second memory lane of the electronic memory;
    determining a fourth delay value for the second memory lane of the electronic memory utilizing the third delay value and the determined difference between the first delay value and the second delay value; and
    training the electronic memory by associating the fourth delay value with the second memory lane.

2. The method of claim 1, wherein training the electronic memory by associating the fourth delay value with the second memory lane comprises:
    programming a hardware register associated with the second memory lane with the fourth delay value.

3. The method of claim 1, further comprising:
    receiving a fifth delay value and a sixth delay value, where the fifth delay value and the sixth delay value are associated with a third data strobe indicating when to sample data on a third memory lane of the electronic memory;
    determining a difference between the fifth delay value and the sixth delay value; and
    combining (A) the determined difference between the first delay value and the second delay value, and (B) the determined difference between the fifth delay value and the sixth delay value, where the fourth delay value for the second memory lane of the electronic memory is determined utilizing the combined difference for (A) the first delay value and the second delay value, and (B) the fifth delay value and the sixth delay value.

4. The method of claim 3, wherein combining (A) the determined difference between the first delay value and the second delay value, and (B) the determined difference between the fifth delay value and the sixth delay value comprises:
    averaging (A) the determined difference between the first delay value and the second delay value, and (B) the determined difference between the fifth delay value and the sixth delay value.

5. The method of claim 3, wherein combining (A) the determined difference between the first delay value and the second delay value, and (B) the determined difference between the fifth delay value and the sixth delay value comprises:
    applying a weighted average to (A) the determined difference between the first delay value and the second delay value, and (B) the determined difference between the fifth delay value and the sixth delay value.

6. The method of claim 3, further comprising:
    receiving a seventh delay value and an eighth delay value, where the seventh delay value and the eighth delay value are associated with a fourth data strobe indicating when to sample data on a fourth memory lane of the electronic memory;
    determining a difference between the seventh delay value and the eighth delay value; and
    combining at least two of (A) the determined difference between the first delay value and the second delay value, (B) the determined difference between the fifth delay value and the sixth delay value, and (C) the determined difference between the seventh delay value and the eighth delay value, where the fourth delay value for the second memory lane of the electronic memory is determined utilizing the combined difference for at least two of (A) the first delay value and the second delay value, (B) the fifth delay value and the sixth delay value, and (C) the seventh delay value and the eighth delay value.

7. The method of claim 6, further comprising:
    determining when to combine (C) the determined difference between the seventh delay value and the eighth delay value with (A) the determined difference between the first delay value and the second delay value, and (B) the determined difference between the fifth delay value and the sixth delay value based upon a statistical analysis.

8. The method of claim 7, wherein determining when to combine (C) the determined difference between the seventh delay value and the eighth delay value with (A) the determined difference between the first delay value and the second delay value, and (B) the determined difference between the fifth delay value and the sixth delay value based upon a statistical analysis comprises:
  discarding the determined difference between the seventh delay value and the eighth delay value when the determined difference between the seventh delay value and the eighth delay value exceeds a threshold value.

9. A method for training an electronic memory, comprising:
  using a computer of processor to perform the steps of:
  receiving a first delay value and a second delay value, where the first delay value and the second delay value are associated with a first data strobe indicating when to sample data on a first memory lane of the electronic memory;
  determining a difference between the first delay value and the second delay value;
  receiving a fifth delay value and a sixth delay value, where the fifth delay value and the sixth delay value are associated with a third data strobe indicating when to sample data on a third memory lane of the electronic memory;
  determining a difference between the fifth delay value and the sixth delay value;
  combining (A) the determined difference between the first delay value and the second delay value, and (B) the determined difference between the fifth delay value and the sixth delay value;
  receiving a third delay value associated with a second data strobe indicating when to sample data on a second memory lane of the electronic memory;
  determining a fourth delay value for the second memory lane of the electronic memory utilizing combined difference for (A) the first delay value and the second delay value, and (B) the fifth delay value and the sixth delay value; and
  training the electronic memory by associating the fourth delay value with the second memory lane.

10. The method of claim 9, wherein training the electronic memory by associating the fourth delay value with the second memory lane comprises:
  programming a hardware register associated with the second memory lane with the fourth delay value.

11. The method of claim 9, wherein combining (A) the determined difference between the first delay value and the second delay value, and (B) the determined difference between the fifth delay value and the sixth delay value comprises:
  averaging (A) the determined difference between the first delay value and the second delay value, and (B) the determined difference between the fifth delay value and the sixth delay value.

12. The method of claim 9, wherein combining (A) the determined difference between the first delay value and the second delay value, and (B) the determined difference between the fifth delay value and the sixth delay value comprises:
  applying a weighted average to (A) the determined difference between the first delay value and the second delay value, and (B) the determined difference between the fifth delay value and the sixth delay value.

13. The method of claim 9, further comprising:
  receiving a seventh delay value and an eighth delay value, where the seventh delay value and the eighth delay value are associated with a fourth data strobe indicating when to sample data on a fourth memory lane of the electronic memory;
  determining a difference between the seventh delay value and the eighth delay value; and
  combining at least two of (A) the determined difference between the first delay value and the second delay value, (B) the determined difference between the fifth delay value and the sixth delay value, and (C) the determined difference between the seventh delay value and the eighth delay value, where the fourth delay value for the second memory lane of the electronic memory is determined utilizing the combined difference for at least two of (A) the first delay value and the second delay value, (B) the fifth delay value and the sixth delay value, and (C) the seventh delay value and the eighth delay value.

14. The method of claim 13, further comprising:
  determining when to combine (C) the determined difference between the seventh delay value and the eighth delay value with (A) the determined difference between the first delay value and the second delay value, and (B) the determined difference between the fifth delay value and the sixth delay value based upon a statistical analysis.

15. The method of claim 14, wherein determining when to combine (C) the determined difference between the seventh delay value and the eighth delay value with (A) the determined difference between the first delay value and the second delay value, and (B) the determined difference between the fifth delay value and the sixth delay value based upon a statistical analysis comprises:
  discarding the determined difference between the seventh delay value and the eighth delay value when the determined difference between the seventh delay value and the eighth delay value exceeds a threshold value.

16. A method for training an electronic memory, comprising:
  using a computer or processor to perform the steps of:
  receiving a first delay value and a second delay value, where the first delay value and the second delay value are associated with a first data strobe indicating when to sample data on a first memory lane of the electronic memory;
  determining a difference between the first delay value and the second delay value;
  receiving a fifth delay value and a sixth delay value, where the fifth delay value and the sixth delay value are associated with a third data strobe indicating when to sample data on a third memory lane of the electronic memory;
  determining a difference between the fifth delay value and the sixth delay value;
  receiving a seventh delay value and an eighth delay value, where the seventh delay value and the eighth delay value are associated with a fourth data strobe indicating when to sample data on a fourth memory lane of the electronic memory;
  determining a difference between the seventh delay value and the eighth delay value;
  combining at least two of (A) the determined difference between the first delay value and the second delay value, (B) the determined difference between the fifth delay value and the sixth delay value, and (C) the determined difference between the seventh delay value and the eighth delay value;

receiving a third delay value associated with a second data strobe indicating when to sample data on a second memory lane of the electronic memory;

determining a fourth delay value for the second memory lane of the electronic memory utilizing the combined difference for at least two of (A) the first delay value and the second delay value, (B) the fifth delay value and the sixth delay value, and (C) the seventh delay value and the eighth delay value; and training the electronic memory by associating the fourth delay value with the second memory lane.

17. The method of claim 16, wherein combining at least two of (A) the determined difference between the first delay value and the second delay value, (B) the determined difference between the fifth delay value and the sixth delay value, and (C) the determined difference between the seventh delay value and the eighth delay value comprises:

averaging (A) the determined difference between the first delay value and the second delay value, (B) the determined difference between the fifth delay value and the sixth delay value, and (C) the determined difference between the seventh delay value and the eighth delay value.

18. The method of claim 16, wherein combining at least two of (A) the determined difference between the first delay value and the second delay value, (B) the determined difference between the fifth delay value and the sixth delay value, and (C) the determined difference between the seventh delay value and the eighth delay value comprises:

applying a weighted average to (A) the determined difference between the first delay value and the second delay value, (B) the determined difference between the fifth delay value and the sixth delay value, and (C) the determined difference between the seventh delay value and the eighth delay value.

19. The method of claim 16, further comprising:

determining when to combine (C) the determined difference between the seventh delay value and the eighth delay value with (A) the determined difference between the first delay value and the second delay value, and (B) the determined difference between the fifth delay value and the sixth delay value based upon a statistical analysis.

20. The method of claim 19, wherein determining when to combine the determined difference between the seventh delay value and the eighth delay value with (A) the determined difference between the first delay value and the second delay value, and (B) the determined difference between the fifth delay value and the sixth delay value based upon a statistical analysis comprises:

discarding the determined difference between the seventh delay value and the eighth delay value when the determined difference between the seventh delay value and the eighth delay value exceeds a threshold value.

* * * * *